(12) United States Patent
Kuroda et al.

(10) Patent No.: US 12,179,486 B2
(45) Date of Patent: Dec. 31, 2024

(54) ACTUATOR, LIQUID DISCHARGE HEAD, LIQUID DISCHARGE DEVICE, AND LIQUID DISCHARGE APPARATUS

(71) Applicants: Takahiko Kuroda, Hyogo (JP);
Kaname Morita, Kanagawa (JP);
Toshiaki Masuda, Kanagawa (JP);
Arata Suzuki, Kanagawa (JP); Naoko Kitaoka, Kanagawa (JP)

(72) Inventors: Takahiko Kuroda, Hyogo (JP);
Kaname Morita, Kanagawa (JP);
Toshiaki Masuda, Kanagawa (JP);
Arata Suzuki, Kanagawa (JP); Naoko Kitaoka, Kanagawa (JP)

(73) Assignee: RICOH COMPANY, LTD., Tokyo (JP)

(*) Notice: Subject to any disclaimer, the term of this patent is extended or adjusted under 35 U.S.C. 154(b) by 7 days.

(21) Appl. No.: 17/863,410

(22) Filed: Jul. 13, 2022

(65) Prior Publication Data
US 2023/0021821 A1 Jan. 26, 2023

(30) Foreign Application Priority Data
Jul. 26, 2021 (JP) .................................. 2021-121834

(51) Int. Cl.
*B41J 2/14* (2006.01)
*H10N 30/20* (2023.01)
*H10N 30/88* (2023.01)

(52) U.S. Cl.
CPC ...... *B41J 2/14201* (2013.01); *H10N 30/2047* (2023.02); *H10N 30/883* (2023.02)

(58) Field of Classification Search
None
See application file for complete search history.

(56) References Cited

U.S. PATENT DOCUMENTS

| | | | |
|---|---|---|---|
| 2006/0232638 | A1 | 10/2006 | Kuroda et al. |
| 2008/0117262 | A1 | 5/2008 | Mori et al. |
| 2008/0309734 | A1 | 12/2008 | Nishimura et al. |
| 2010/0231632 | A1 | 9/2010 | Kobayashi et al. |
| 2011/0007112 | A1 | 1/2011 | Takei et al. |

(Continued)

FOREIGN PATENT DOCUMENTS

| | | |
|---|---|---|
| JP | 6-283615 | 10/1994 |
| JP | 2002-009152 | 1/2002 |

(Continued)

OTHER PUBLICATIONS

Extended European Search Report issued Nov. 28, 2022, in corresponding European Patent Application No. 22182772.8.

*Primary Examiner* — Erica S Lin
(74) *Attorney, Agent, or Firm* — XSENSUS LLP

(57) ABSTRACT

An actuator includes a deformable thin-film member having an opening, an electromechanical conversion element disposed at a periphery of the opening of the deformable thin-film member, an insulating film covering the electromechanical conversion element, a protective film over a surface of the insulating film, the protective film covering the surface of the insulating film and a surface of an electrode wiring connected to the electromechanical conversion element, and an adhesion improving film disposed between the electrode wiring and the protective film.

13 Claims, 6 Drawing Sheets

(56) References Cited

U.S. PATENT DOCUMENTS

| | | | |
|---|---|---|---|
| 2011/0030212 A1* | 2/2011 | Hamatani | H01L 23/3164 29/874 |
| 2011/0056808 A1 | 3/2011 | Satoh et al. | |
| 2011/0298864 A1 | 12/2011 | Yuichi et al. | |
| 2012/0211761 A1* | 8/2012 | Yamada | H01L 29/7787 438/300 |
| 2012/0236083 A1* | 9/2012 | Mizukami | B41J 2/1612 347/70 |
| 2014/0071207 A1 | 3/2014 | Nakatani | |
| 2014/0267506 A1 | 9/2014 | Ohnishi et al. | |
| 2015/0002587 A1* | 1/2015 | Yokoyama | B41J 2/14201 347/70 |
| 2015/0070444 A1 | 3/2015 | Ishimori et al. | |
| 2016/0185110 A1 | 6/2016 | Masuda et al. | |
| 2018/0085757 A1 | 3/2018 | Yokoyama et al. | |
| 2018/0358299 A1* | 12/2018 | Fischer | H01L 21/76852 |
| 2019/0081039 A1* | 3/2019 | Siemieniec | H01L 29/66068 |
| 2019/0176469 A1 | 6/2019 | Kuroda et al. | |
| 2019/0270310 A1 | 9/2019 | Masuda et al. | |
| 2020/0269575 A1 | 8/2020 | Kobayashi et al. | |
| 2020/0324545 A1* | 10/2020 | Giusti | B41J 2/1626 |
| 2020/0391510 A1 | 12/2020 | McAvoy | |
| 2021/0039393 A1 | 2/2021 | Mizukami et al. | |
| 2021/0162759 A1 | 6/2021 | Miwa | |
| 2021/0252862 A1 | 8/2021 | Masuda | |
| 2022/0032622 A1 | 2/2022 | Kitaoka | |
| 2022/0097373 A1 | 3/2022 | Masuda | |

FOREIGN PATENT DOCUMENTS

| | | |
|---|---|---|
| JP | 2015-186842 | 10/2015 |
| JP | 2016-52723 A | 4/2016 |
| JP | 2018-047429 | 3/2018 |
| JP | 2019-098708 | 6/2019 |

* cited by examiner

ACTUATOR, LIQUID DISCHARGE HEAD, LIQUID DISCHARGE DEVICE, AND LIQUID DISCHARGE APPARATUS

CROSS-REFERENCE TO RELATED APPLICATIONS

This patent application is based on and claims priority pursuant to 35 U.S.C. § 119(a) to Japanese Patent Application No. 2021-121834, filed on Jul. 26, 2021, in the Japan Patent Office, the entire disclosure of which is hereby incorporated by reference herein.

BACKGROUND

Technical Field

Aspect of this disclosure relates to an actuator, a liquid discharge head, a liquid discharge device, and a liquid discharge apparatus.

Related Art

The liquid discharge head includes a deformable nozzle plate having a nozzle to discharge a liquid and a deformable piezoelectric element on the nozzle plate. The liquid discharge head deforms the nozzle plate to pressurize the liquid in a liquid chamber to discharge the liquid from the nozzle.

For example, the liquid discharge head includes a substrate, a diaphragm, and the nozzle plate. The substrate has a first surface, a second surface opposite to the first surface, and a cylindrical hole communicating with the first surface and the second surface. The diaphragm laminated on the first surface of the substrate to close one end of the hole to forms

SUMMARY

An actuator includes a deformable thin-film member having an opening, an electromechanical conversion element disposed at a periphery of the opening of the deformable thin-film member, an insulating film covering the electromechanical conversion element, a protective film over a surface of the insulating film, the protective film covering the surface of the insulating film and a surface of an electrode wiring connected to the electromechanical conversion element, and an adhesion improving film disposed between the electrode wiring and the protective film.

A liquid discharge head includes the actuator, and a liquid chamber communicating with the opening of the deformable thin-film member.

A liquid discharge device includes the liquid discharge head; and a supply unit configured to supply the liquid to the liquid discharge head.

A liquid discharge apparatus includes the liquid discharge device.

BRIEF DESCRIPTION OF THE DRAWINGS

A more complete appreciation of the disclosure and many of the attendant advantages and features thereof can be readily obtained and understood from the following detailed description with reference to the accompanying drawings, wherein.

Figure 1:
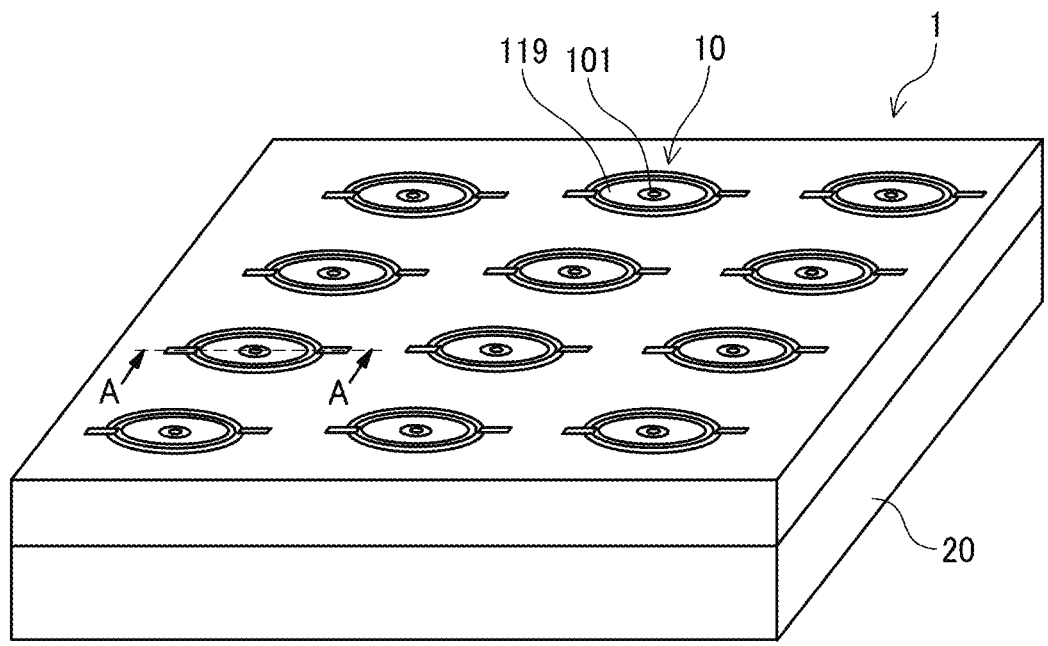
FIG. 1 is an exploded perspective view of a liquid discharge head according to a first embodiment of the present disclosure.

The accompanying drawings are intended to depict embodiments of the present invention and should not be interpreted to limit the scope thereof. The accompanying drawings are not to be considered as drawn to scale unless explicitly noted. Also, identical or similar reference numerals designate identical or similar components throughout the several views.

DETAILED DESCRIPTION OF EMBODIMENTS

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Referring now to the drawings, embodiments of the present disclosure are described below. As used herein, the singular forms "a", "an", and "the" are intended to include the plural forms as well, unless the context clearly indicates otherwise.

It will also be understood that when an element is referred to as being "connected" or "coupled" to another element, it can be directly connected or coupled to another element or intervening elements may be present.

In contrast, when an element is referred to as being "directly connected" or "directly coupled" to another element, there are no intervening elements present. Referring now to the drawings, wherein like reference numerals designate identical or corresponding parts throughout the several views, embodiments of the present disclosure are described below.

Referring now to the drawings, wherein like reference numerals designate identical or corresponding parts throughout the several views, embodiments of the present disclosure are described below.

Next, a liquid discharge head 1 according to a first embodiment of the present disclosure is described with reference to FIGS. 1 and 2.

FIG. 1 is exploded perspective view a liquid discharge head 1 according to the first embodiment of the present disclosure.

Figure 2:
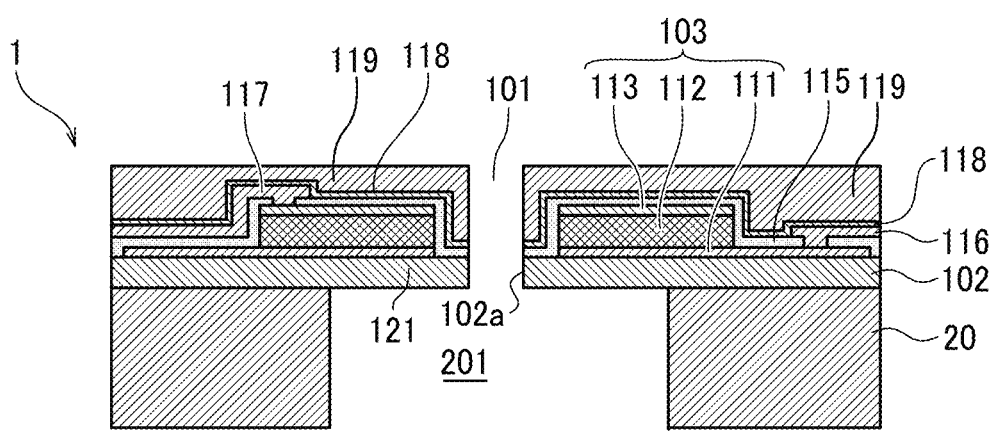
FIG. 2 is a cross-sectional side view of the liquid discharge head along a line A-A of FIG. 1.

FIG. 2 is a cross-sectional side view of the liquid discharge apparatus along a line A-A of FIG. 1.

The liquid discharge head 1 includes multiple actuators 10 and a chamber forming member 20. Hereinafter "the liquid discharge head" is simply referred to as the "head".

The actuator 10 includes a thin-film member 102 and a piezoelectric element 103 (see FIG. 2). The thin-film member 102 serves as a deformable nozzle plate and a diaphragm having an opening 102a. The opening 102a forms a nozzle 101 from which a liquid is discharged. The piezoelectric element 103 is formed by an annular electromechanical conversion element disposed on one surface (upper surface in FIG. 2) of the thin-film member 102 around the opening 102a (nozzle 101).

Thus, the electromechanical conversion element such as the piezoelectric element 103 has an annular shape surrounding the opening 102a (nozzle 101).

Thus, the piezoelectric element 103 is an example of the electromechanical conversion element.

The piezoelectric element 103 is formed by sequentially laminating a lower electrode 111, a piezoelectric film 112 as an electromechanical conversion film, and an upper electrode 113 on one surface (upper surface in FIG. 2) of the thin-film member 102. The actuator 10 includes an insulating film 115 covering the piezoelectric element 103.

In the piezoelectric element 103, the insulating film 115 is opened, and an electrode wiring 116 is connected to the lower electrode III as a lower electrode lead wiring. An electrode wire 117 serving as an upper electrode lead wire is connected (coupled) to the upper electrode 113.

Further, an adhesion improving film 118 is formed on each of surfaces including a surface of the insulating film 115 of the piezoelectric element 103 and surfaces of electrode wirings 116 and 117. A protective film 119 is formed on this adhesion improving film 118.

In other words, the actuator 10 includes the protective film 119 over a surface of the insulating film 115 to cover the electrode wirings 116 and 117 connected (coupled) to the piezoelectric element 103. Further, the adhesion improving film 118 is interposed at least between the electrode wirings 116 and 117 and the protective film 119.

The adhesion improving film 118 continuously extends over the electrode wirings 116 and 117, the insulating film 115, and the piezoelectric element 103. Multiple openings 102a are partially opened in the adhesion improving film 118 as the nozzles 101 (see FIGS. 1 and 2). The adhesion improving film 118 is also referred to as an "adhesion layer".

The adhesion improving film 118 is a layer having a function of increasing the adhesion between the protective film 119 and the electrode wirings 116 and 117 as compared with a case in which the protective film 119 is directly formed on the surfaces of the electrode wirings 116 and 117.

Here, the insulating film 115 is an $SiO_2$ film, the protective film 119 is a resin film formed from benzocyclobutene (BCB), and the adhesion improving film 118 is an $SiO_2$ film.

A chamber forming member 20 is bonded to another surface (lower surface in FIG. 2) of the thin-film member 102 of the actuator 10. The chamber forming member 20 has a liquid chamber 201 with which the nozzle 101 (opening 102a) communicates.

A portion in the thin-film member 102 that faces a liquid chamber 201 becomes a displaceable portion 121.

The above-described configuration can improve the adhesion between the protective film 119 made of benzocyclobutene (BCB) and the electrode wirings 116 and 117.

The actuator 10 according to the first embodiment includes the protective film 119 serving as an uppermost layer film. The protective film 119 is film-formed using a material of benzocyclobutene (BCB) having high chemical resistance, low moisture absorption, high heat resistance, high planarization, and high liquid repellency. However, if the protective film 119 made of BCB is directly formed on a foundation layer, it is difficult to ensure that the protective film 119 is sufficiently adhere to the wiring material of the electrode wirings 116 and 117.

Particularly, the aluminum wiring forming the electrode wirings 116 and 117 and the protective film 119 are displaced when the actuator 10 is driven. The electrode wirings 116 and 117 are disposed in the displaceable portion 121 Therefore, stress is generated in the electrode wirings 116 and 117 and the protective film 119. If the adhesion between the protective film 119 and the electrode wirings 116 and 117 is not sufficient, the protective film 119 may be peeled off at an interface between the protective film 119 and the electrode wirings 116 and 117. Thus, actuator 10 may not function to perform a liquid discharge operation or may not ensure reliability.

However, the adhesion of the protective film 119 made of BCB at an interface is greatly affected by the foundation material. A covalent bond is formed between the protective film 119 and the foundation material to ensure sufficient adhesion.

The $SiO_2$ film is used as the insulating film 115 that covers the piezoelectric element 103. If a surface of the foundation is clean, the $SiO_2$ film can form a strong siloxane bond (—O—Si—O—) with the protective film 119. However, the adhesion of the $SiO_2$ film with the metal material (here, aluminum wiring) forming the electrode wirings 116 and 117 is inferior to the adhesion with the insulating film 115.

Therefore, the $SiO_2$ film is formed as the adhesion improving film 118 on the surfaces of the electrode wirings 116 and 117 so that a strong covalent bond (siloxane bond) can be formed between the $SiO_2$ film and the protective film 119 as similarly with the insulating film 115. Thus, the actuator 10 in the first embodiment includes a film contacting the protective film 119 as the $SiO_2$ film. The $SiO_2$ film serves as the adhesion improving film 118 that covers the entire surface of the electrode wirings 116 and 117 that faces (opposed to) the protective film 119.

A thickness of the adhesion improving film 118 is preferably 10 nm or less since the thickness of the adhesion improving film 118 affects the rigidity of the thin-film member 102. Thus, the thickness of the adhesion improving film 118 is equal to or smaller than 10 nm.

The adhesion improving film 118 may be film-formed by a method of sputtering, vapor deposition, atomic layer deposition (ALD), or the like. Functionally, the film formation by the ALD method is preferable from the viewpoints of thin-film formation, step coverage, film quality stability, and film thickness uniformity.

The BCB film used as the protective film 119 is excellent in low moisture absorption as a resin. However, a function of the moisture absorption of the BCB film is inferior to the moisture absorption of inorganic substances. Therefore, a barrier layer such as an $Al_2O_3$ film or a SiN film having lower moisture permeability than the protective film 119 is provided on the surface of the foundation layer including the insulating film 115 and electrode wirings 116 and 117. The adhesion improving film 118 is provided (formed) on this barrier layer to further improve the reliability.

Note that the insulating film 115 is not limited to the $SiO_2$ film, and a SiN film or the like may be used as the insulating film 115. In the case in which the SiN film is used as the insulating film 115 instead of the $SiO_2$ film, the adhesion improving film 118 including the surface of the insulating film 115 is formed to improve the adhesion between the protective film 119 and the foundation layer as in the present embodiment.

Next, an example of a manufacturing process of the head 1 according to the first embodiment is described below with reference to FIGS. 3A to 3C and FIGS. 4A to 4C.

FIGS. 3A to 3C and FIGS. 4A to 4C are cross-sectional views of the head 1 illustrating the manufacturing process of the head 1.

Figure 3A:
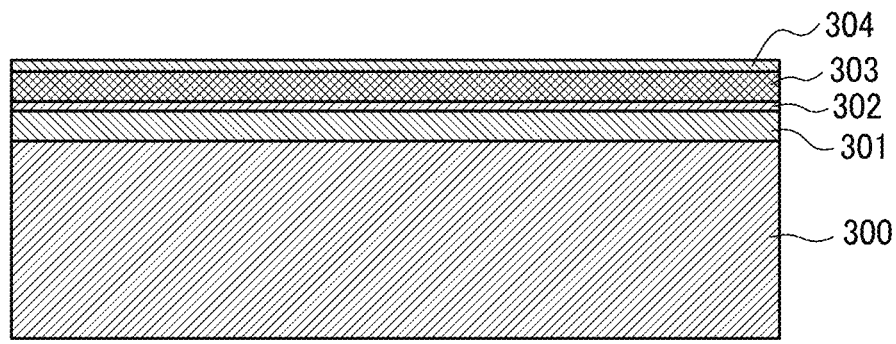
FIGS. 3A to 3C are cross-sectional side views of the liquid discharge head illustrating the manufacturing process of the liquid discharge head according to the first embodiment.

As illustrated in FIG. 3A, a silicon oxide film 301 ($SiO_2$ film 301) having a thickness of 2 µm is formed, by plasma chemical vapor deposition (plasma CVD), on a silicon substrate 300 having a crystal plane orientation (100) and a plate thickness of 625 µm. The $SiO_2$ film 301 is formed to be the thin-film member 102 (see FIG. 2). The silicon substrate 300 is formed to be the chamber forming member 20

Then, a $TiO_2$ film and Pt are film-formed by sputtering to a film thickness of 50 nm and 120 nm, respectively, on the $SiO_2$ film 301. The $TiO_2$ film and Pt serve as a lower electrode layer 302 that becomes the lower electrode 111 (see FIG. 2). The $TiO_2$ film serves as an adhesion layer with the $SiO_2$ film 301. The Pt serves as an electrode. The $TiO_2$ film may be formed by forming a film of Ti by sputtering and then oxidizing the film of Ti by a rapid thermal anneal (RTA) method in an oxygen atmosphere.

Further, a piezoelectric (PZT) film 303 is formed on the lower electrode layer 302 in multiple steps by, for example, a spin coating method, and finally film-formed to a thickness of 2 µm. The PZT film 303 serves as the piezoelectric film 112 On this PZT film 303, Pt is film-formed with a film thickness of, for example, 100 nm by sputtering.

A film (layer) of Pt serves as an upper electrode layer 304 that becomes the upper electrode 113. Here, the film-forming method of the PZT film 303 is not limited to the spin coating method, and may be formed by, for example, a sputtering method, an ion plating method, an aerosol method, a sol-gel method, an inkjet method, or the like.

Figure 3B:
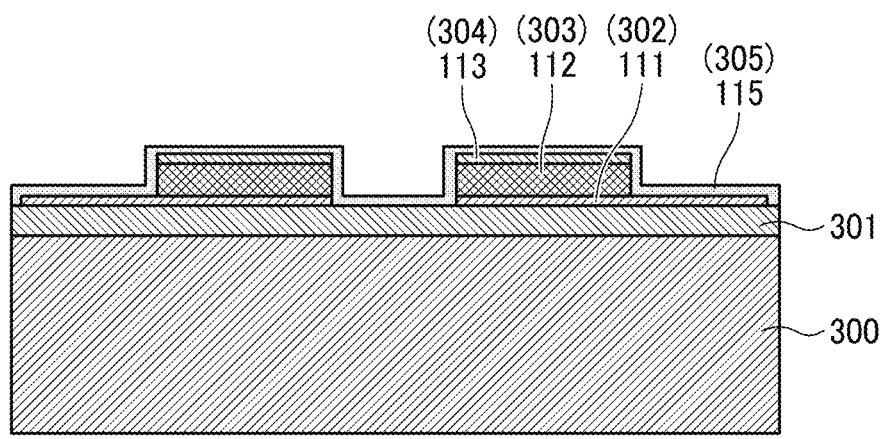

Then, as illustrated in FIG. 3B, the upper electrode layer 304, the PZT film 303, and the lower electrode layer 302 are patterned by a lithography-etching method to dispose the piezoelectric element 103 at a position corresponding to the liquid chamber 201 to be formed later. As a result, the upper electrode 113, the piezoelectric film 112, and the lower electrode 111 are formed as illustrated in FIG. 3B. Then, an $SiO_2$ film 305 is formed to a thickness of, for example, 1 µm by the plasma CVD method as the insulating film 115.

Figure 3C:
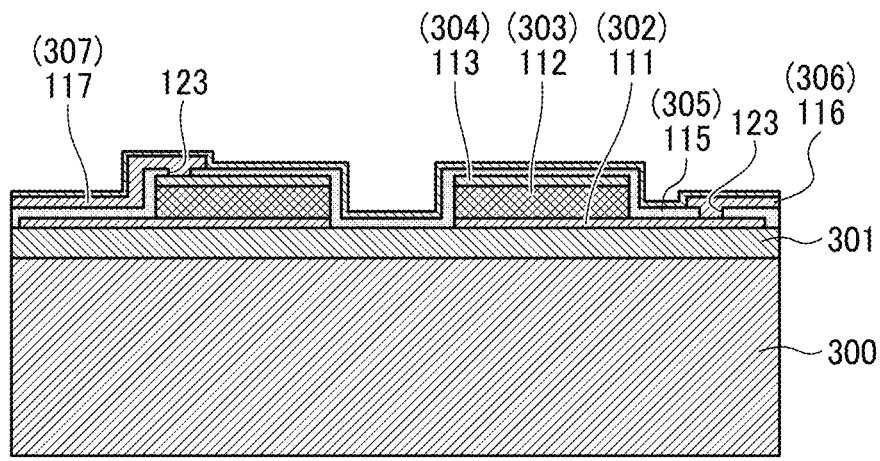

Next, as illustrated in FIG. 3C, a contact portion 123 that connects the lower electrode 111 and the electrode wiring 116 and a contact portion 123 that connects the upper electrode 113 and the electrode wiring 117 are formed on the $SiO_2$ film 305 by the lithography-etching method.

Then, TiN/AL films 306 and 307 are formed with a film thickness of 30 nm and 1 µm, respectively, by sputtering. The TiN/AL films 306 and 307 respectively serve as the electrode wirings 116 and 117, for example. Here, Pt as a material of the upper electrode 113 or the lower electrode 111 directly contacts with Al as a material of a lead wiring at a bottom of the contact portion 123 so that TiN is alloyed by a thermal history in a later process. Thus, the TiN is applied as a barrier layer to prevent film from peeling due to stress caused by volume change.

Then, the TiN/Al films 306 and 307 are formed in desired patterns by the lithography-etching method, thereby forming electrode wirings 116 and 117, respectively.

Then, a $SiO_2$ film 308 is film-formed as the adhesion improving film 118 to obtain sufficient adhesion with the protective film 119. The $SiO_2$ film 308 is formed by, for example, an atomic layer deposition (ALD) method capable of forming a thin-film with good step coverage and good uniformity. The $SiO_2$ film 308 has a thickness that does not hinder a displacement of the displaceable portion 121. Further, the protective film 119 and the adhesion improving film 118 may be formed by siloxane bonding (—O—Si—O—). Thus, it is sufficient that the $SiO_2$ film 308 has only one $SiO_2$ molecular layer.

Figure 4A:
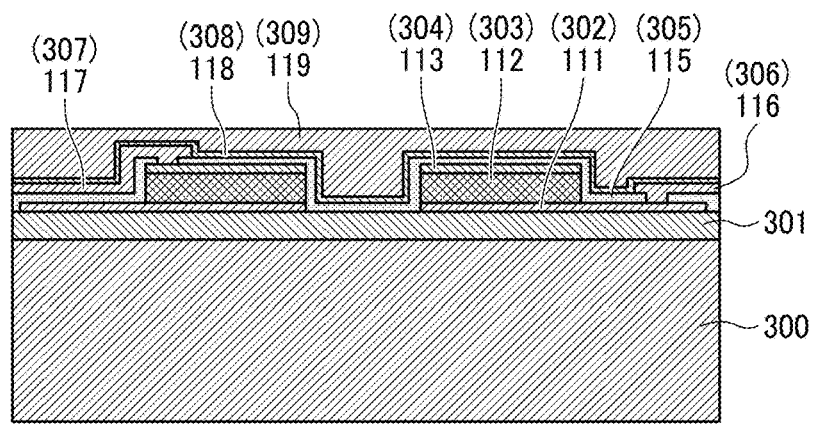
FIGS. 4A to 4C are cross-sectional side views of the liquid discharge head illustrating the manufacturing process of the liquid discharge head after FIGS. 3A to 3C.

Next, as illustrated in FIG. 4A, a benzocyclobutene (BCB) film 309 having a thickness of 4 µm is film-formed as a protective film 119 by a spin coating method. Then, the BCB film 309 is heat treated in a nitrogen atmosphere at 250° C. for one hour for polymerization and curing.

Figure 4B:
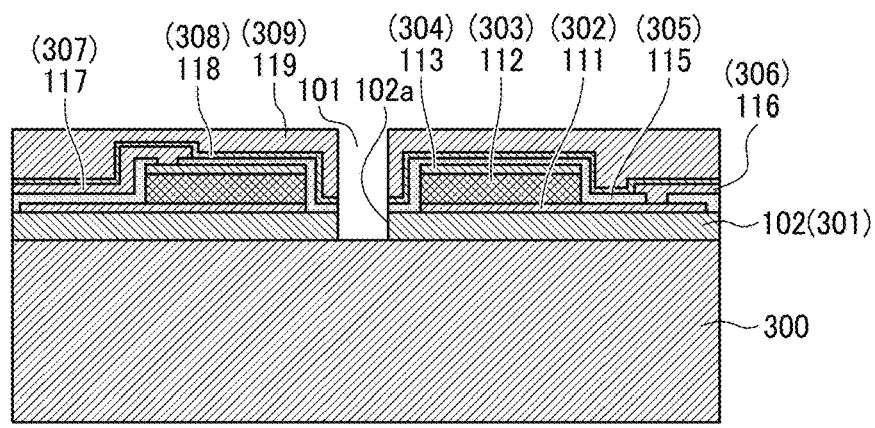

Then, the silicon substrate 300 is polished to a desired depth of the liquid chamber 201 as illustrated in FIG. 4B.

Next, a resist pattern is formed by a lithography-etching method to form the nozzle 101. Further, the BCB film 309 serving as the protective film 119, the $SiO_2$ film 308 serving as the adhesion improving film 118, the $SiO_2$ film 305 serving as the insulating film 115, and the $SiO_2$ film 301 serving as the thin-film member 102 are etched. The etching is performed by dry etching. The BCB film 309 is etched by a gas of $O_2$ or $CF_4/O_2$. For example, the BCB film 309 is etched by a reactive ion etching (RIE) etcher or a high-density plasma etcher.

Figure 4C:
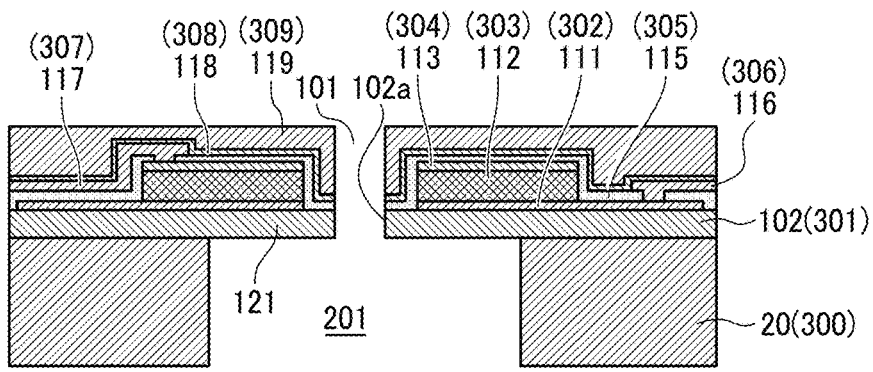

Then, the silicon substrate 300 is etched to form an opening serving as the chamber forming member 20 as illustrated in FIG. 4C.

Thus, the head 1 is formed by the above-described processes.

In this head 1, the adhesion of the protective film 119 is secured and high reliability can be obtained since the adhesion improving film 118 is interposed between the protective film 119 and the foundation layer (the insulating film 115, and the electrode wirings 116 and 117).

Thus, the actuator 10 includes the deformable thin-film member 102 having the opening 102a (nozzle 101), the electromechanical conversion element (piezoelectric element 103) disposed at a periphery of the opening 102a (nozzle 101) of the deformable thin-film member 102, an insulating film 115 covering the electromechanical conversion element (piezoelectric element 103), the protective film 119 over the surface of the insulating film 115, the protective film 119 covering the surface of the insulating film 115 and the surface of the electrode wirings 116 and 117 connected to the electromechanical conversion element (piezoelectric element 103), and the adhesion improving film 118 disposed between the electrode wirings 116 and 117 and the protective film 119.

A head 1 according to a second embodiment of the present disclosure is described with reference to FIG. 5.

Figure 5:
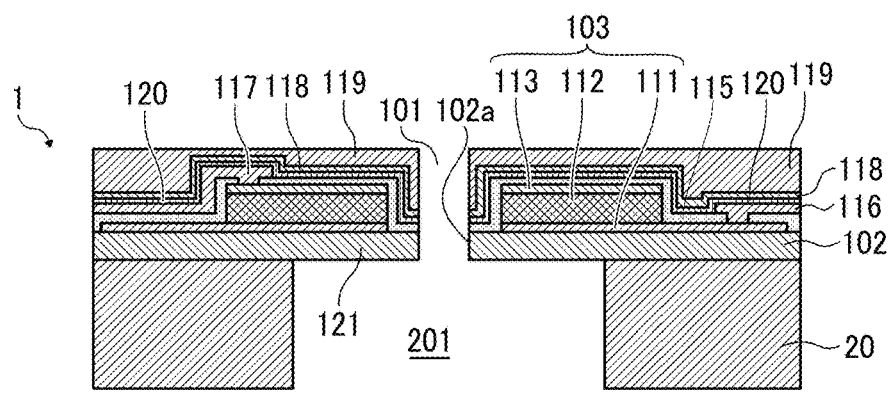
FIG. 5 is a cross-sectional side view of the liquid discharge head according to a second embodiment of the present disclosure.

FIG. 5 is a cross-sectional side view of the head 1 according to the second embodiment of the present disclosure.

The head 1 in the second embodiment includes a barrier layer 120 between the adhesion improving film 118 and the foundation layer (insulating film 115, and electrode wirings 116 and 117). A film of $Al_2O_3$, SiN, or the like can be used as the barrier layer 120, for example.

When the BCB film 309 is used as the protective film 119, the resin is excellent in low moisture absorption, but the moisture permeability is relatively high as compared with an inorganic material. Therefore, the head 1 includes a barrier layer 120 having higher moisture permeability resistance than the protective film 119, that is, having lower moisture permeability Thus, moisture permeated through the protective film 119 is blocked by the barrier layer 120, and the head 1 can obtain further higher reliability.

The head 1 includes a two layer film of $SiO_2$/SiN or a two layer film of $Al_2O_3$/$SiO_2$ in place of the barrier layer 120 to form a three layer film structure as a whole to improve the adhesion between the adhesion improving film 118 and the foundation layer (insulating film 115, and electrode wirings 116 and 117).

Thus, the barrier layer 120 has a moisture permeability lower than the protective film 119. One surface of the barrier layer 120 contacting the surface of the insulating film 115 and the surface of the electrode wirings 116 and 117, and another surface of the barrier layer 120 contacting the adhesion improving film 118.

Next, an example of a liquid discharge apparatus 1000 according to an embodiment of the present disclosure is described with reference to FIGS. 6 and 7.

Figure 6:
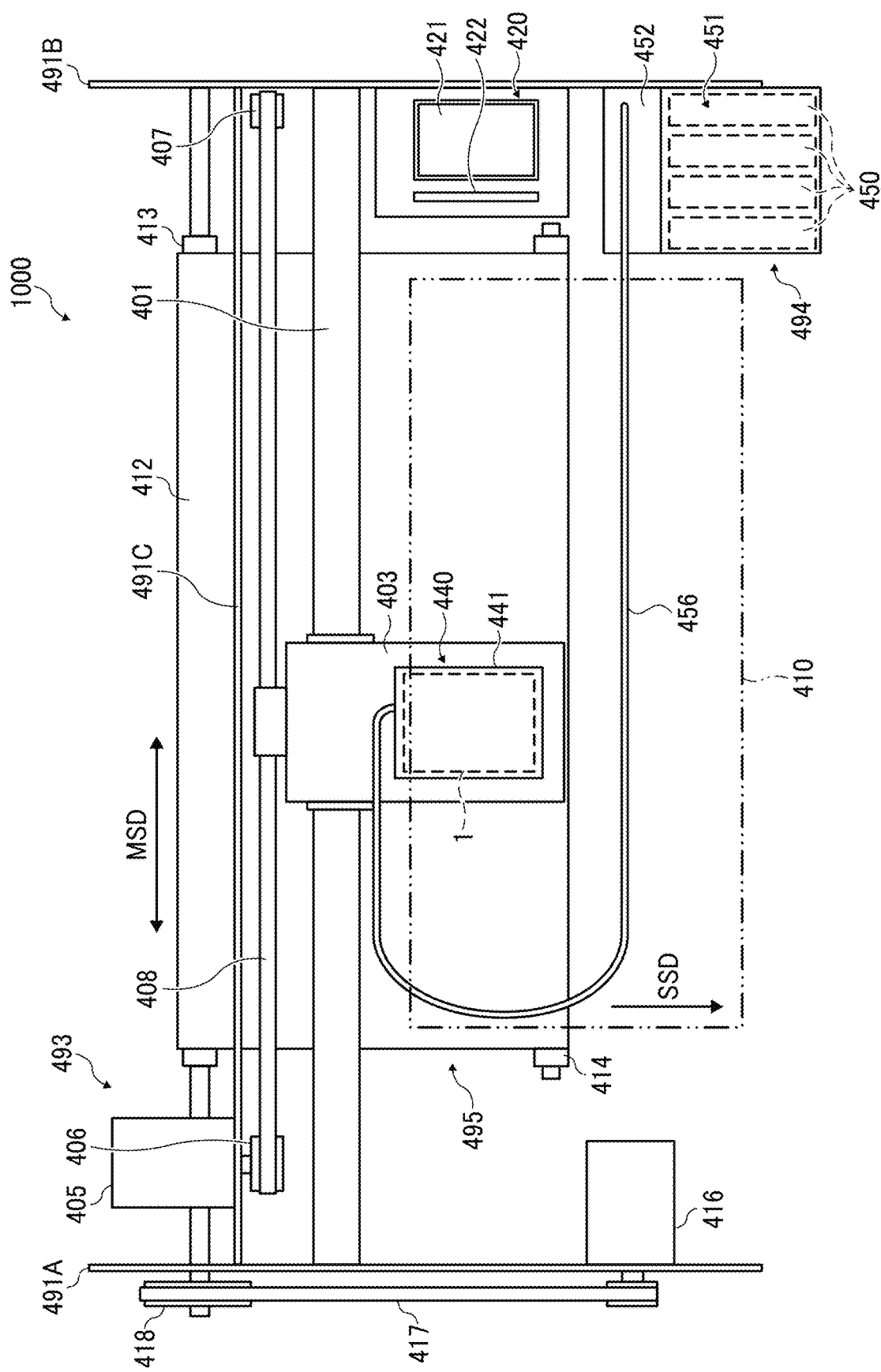
FIG. 6 is a plan view of a main part of a liquid discharge apparatus according to an embodiment of the present disclosure.

FIG. 6 is a plan view of a portion of the liquid discharge apparatus 1000.

Figure 7:
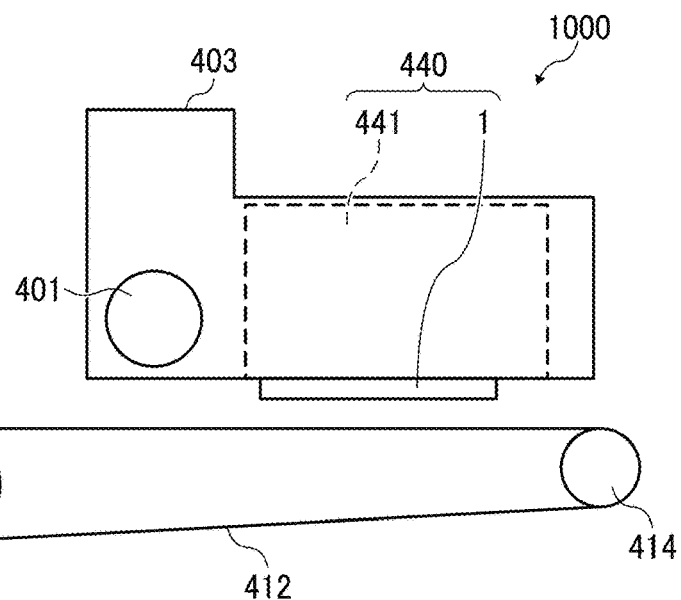
FIG. 7 is a schematic side view of a main portion of the liquid discharge apparatus.

FIG. 7 is a side view of a portion of the liquid discharge apparatus 100) of FIG. 6.

The liquid discharge apparatus 1000 is a serial-type apparatus, and a carriage 403 reciprocally moves in a main scanning direction by a main scan moving unit 493. The main scanning direction is indicated by arrow "MSD" in FIG. 6. The main scan moving unit 493 includes a guide 401, a main scan motor 405, a timing belt 408, and the like.

The guide 401 is bridged between a left-side plate 491A and a right-side plate 491B to moveably hold the carriage 403. The main scan motor 405 reciprocally moves the carriage 403 in the main scanning direction MSD via the timing belt 408 bridged between a drive pulley 406 and a driven pulley 407.

The carriage 403 mounts a liquid discharge device 440. The head 1 and a head tank 441 forms the liquid discharge device 440 as a single unit. The head 1 has a configuration of one of the head 1 illustrated in FIGS. 1 to 5. The head 1 of the liquid discharge device 440 discharges liquid of each color, for example, yellow (Y), cyan (C), magenta (M), and black (K). The head 1 includes a nozzle array including multiple nozzles 101 arrayed in a sub-scanning direction as indicated by arrow "SSD". The sub-scanning direction is orthogonal to the main scanning direction MSD. The head 1 is mounted to the carriage 403 so that ink droplets are discharged downward.

The liquid stored in liquid cartridges 450 is supplied to the head tank 441 by a supply unit 494 to supply the liquid stored outside the head 1 (liquid cartridges 450) to the head 1.

The supply unit 494 includes a cartridge holder 451 serving as a filling part to mount the liquid cartridges 450, a tube 456, a liquid feeder 452 including a liquid feed pump, and the like. The liquid cartridge 450 is detachably attached to the cartridge holder 451. The liquid is fed from the liquid cartridge 450 to the head tank 441 by the liquid feeder 452 via the tube 456.

The liquid discharge apparatus 1000 includes a conveyor 495 to convey a sheet 410. The conveyor 495 includes a conveyance belt 412 as a conveyor and a sub scan motor 416 to drive the conveyance belt 412. The sheet 410 is an example of a medium (object) onto which a liquid is to be discharged from the head 1.

The conveyance belt 412 attracts the sheet 410 and conveys the sheet 410 to a position facing the head 1. The conveyance belt 412 is an endless belt stretched between a conveyance roller 413 and a tension roller 414. Attraction of the sheet 410 to the conveyance belt 412 may be applied by electrostatic adsorption, air suction, or the like.

The conveyance belt 412 rotates in the sub-scanning direction SSD as the conveyance roller 413 is rotationally driven by the sub scan motor 416 via a timing belt 417 and a timing pulley 418.

At one side in the main scanning direction MSD of the carriage 403, a maintenance unit 420 to maintain the head 1 in good condition is disposed on a lateral side of the conveyance belt 412.

The maintenance unit 420 includes, for example, a cap 421 to cap a nozzle face (i.e., a face on which nozzles are formed) of the head 1 and a wiper 422 to wipe the nozzle face.

The main scan moving unit 493, the supply unit 494, the maintenance unit 420, and the conveyor 495 are mounted to a housing that includes a left-side plate 491A, a right-side plate 491B, and a rear-side plate 491C.

In the liquid discharge apparatus 1000 thus configured, the sheet 410 is conveyed on and attracted to the conveyance belt 412 and is conveyed in the sub-scanning direction SSD by the cyclic rotation of the conveyance belt 412.

The head 1 is driven in response to image signals while the carriage 403 moves in the main scanning direction MSD, to discharge a liquid to the sheet 410 stopped, thus forming an image on the sheet 410.

As described above, the liquid discharge apparatus 1000 includes the head 1 according to the above-described embodiments of the present disclosure, thus allowing stable formation of high quality images.

Figure 8:
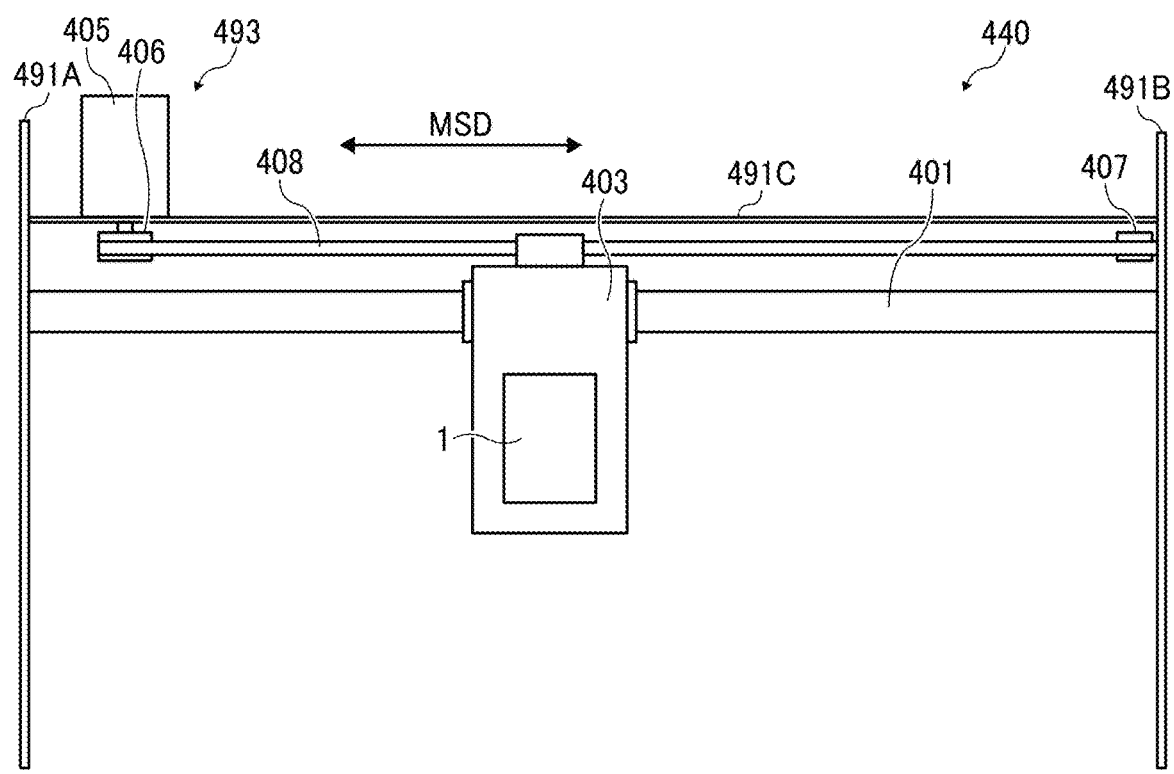
FIG. 8 is a schematic plan view of a portion of another example of a liquid discharge device according to an embodiment of the present disclosure.

Next, the liquid discharge device 440 according to another embodiment of the present disclosure is described with reference to FIG. 8. FIG. 8 is a plan view of a portion of the liquid discharge device 440 according to another embodiment of the present disclosure. The liquid discharge device 440 includes a housing, the main scan moving unit 493, the carriage 403, and the head 1 among components of the liquid discharge apparatus 1000. The left-side plate 491A, the right-side plate 491B, and the rear-side plate 491C configure the housing.

The liquid discharge device 440 may be configured to further attach at least one of the above-described maintenance unit 420 and the supply unit 494 to, for example, the right-side plate 491B of the liquid discharge device 440.

Next, still another example of the liquid discharge device 440 according to the present embodiment is described with reference to FIG. 9.

Figure 9:
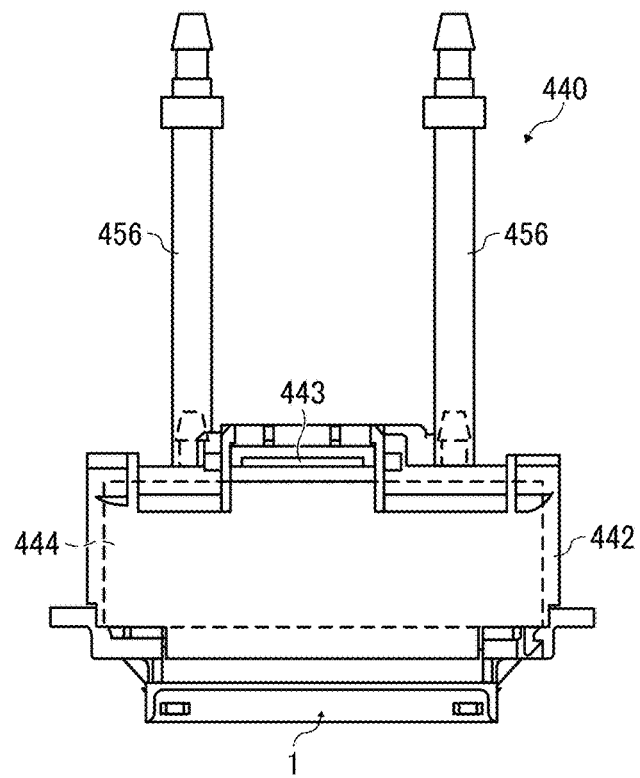
FIG. 9 is a schematic front view of still another example of the liquid discharge device according to an embodiment of the present disclosure.

FIG. 9 is a front view of still another example of the liquid discharge device 440.

The liquid discharge device 440 includes the head 1 to which a channel part 444 is mounted and a tube 456 connected to the channel pan 444.

Further, the channel part 444 is disposed inside a cover 442. Instead of the channel pan 444, the liquid discharge device 440 may include the head tank 441. A connector 443 electrically connected with the head 1 is provided on an upper part of the channel part 444.

Still another example of the liquid discharge apparatus 1000 according to the present embodiment is described with reference to FIG. 10.

Figure 10:
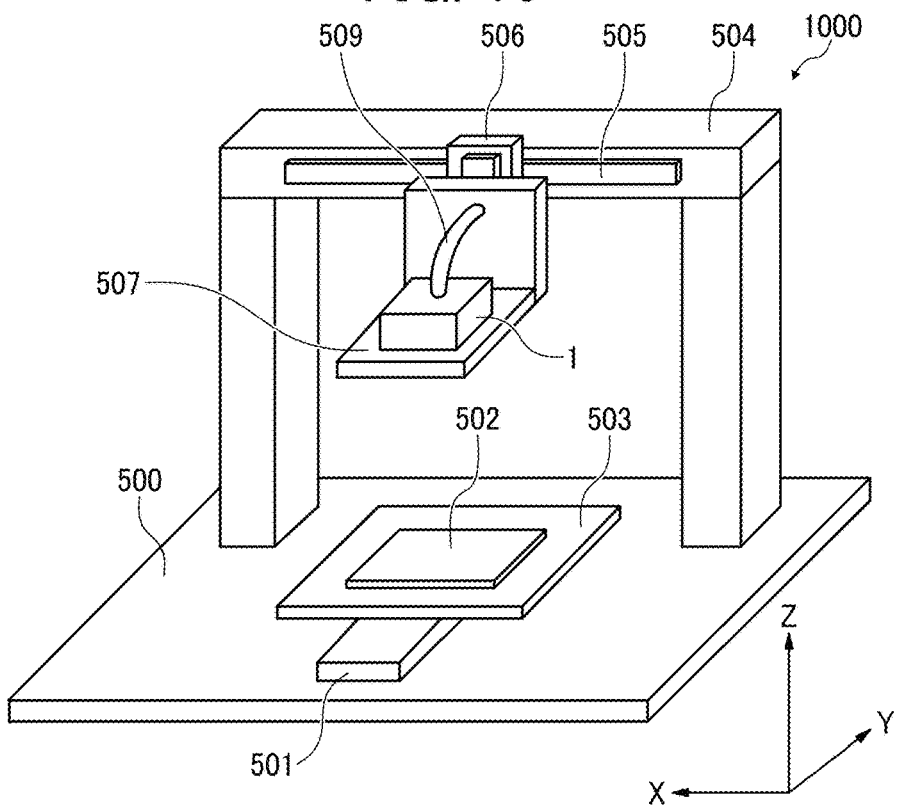
FIG. 10 is a perspective view of another example of a liquid discharging apparatus according to an embodiment of the present disclosure.

FIG. 10 is a perspective view of the liquid discharge apparatus 1000.

In this liquid discharge apparatus 1000, a Y-axis driver 501 is disposed on a frame 500. A stage 503 to mount an object 502 is set on the Y-axis driver 501. The Y-axis driver 501 reciprocally moves the stage 503 in a Y-axis direction as indicated by arrow in FIG. 10. The object 502 is an example of a medium onto which a liquid is discharged from the head 1.

An X-axis driver 505 is attached to an X-axis support 504. A head base 507 mounted on a Z-axis driver 506 is attached to this X-axis driver 505. The head base 507 is moved in an X-axis direction and a Z-axis direction as indicated by arrows in FIG. 10.

The Y-axis driver 501 serves as a conveyor to convey the object 502 to a position facing the head 1.

One or more heads 1 according to the above-described embodiments according to the present disclosure to discharge a liquid are mounted on the head base 507. The liquid is supplied from the liquid reservoir to the head 1 via a supply unit 509 such as a tube and a pump.

The liquid discharge apparatus including the liquid discharge head according to the above-described embodiments can highly efficiently discharge a liquid.

In the present embodiments, a "liquid" discharged from the head is not particularly limited as long as the liquid has a viscosity and surface tension of degrees dischargeable from the head. Preferably, the viscosity of the liquid is not greater than 30 mPa·s under ordinary temperature and ordinary pressure or by heating or cooling.

Examples of the liquid include a solution, a suspension, or an emulsion that contains, for example, a solvent, such as water or an organic solvent, a colorant, such as dye or pigment, a functional material, such as a polymerizable compound, a resin, or a surfactant, a biocompatible material, such as DNA, amino acid, protein, or calcium, or an edible material, such as a natural colorant.

Such a solution, a suspension, or an emulsion can be used for, e.g., inkjet ink, surface treatment solution, a liquid for forming components of electronic element or light-emitting element or a resist pattern of electronic circuit, or a material solution for three-dimensional fabrication.

Examples of an energy source to generate energy to discharge liquid include a piezoelectric actuator (a laminated piezoelectric element or a thin-film piezoelectric element), a thermal actuator that employs a thermoelectric conversion element, such as a heating resistor, and an electrostatic actuator including a diaphragm and opposed electrodes.

For example, the "liquid discharge device" includes a combination of the head with at least one of a head tank, a carriage, a supply unit, a maintenance unit, and a main scan moving unit to form a single unit.

Here, examples of the "single unit" include a combination in which the head and a functional part(s) or unit(s) are secured to each other through, e.g., fastening, bonding, or engaging, and a combination in which one of the head and a functional part(s) or unit(s) is movably held by another. Further, the head, the functional parts, and the mechanism may be configured to be detachable from each other.

For example, the head and the head tank may form the liquid discharge device as a single unit. Alternatively, the head and the head tank coupled (connected) with a tube or the like may form the liquid discharge device as a single unit. A unit including a filter may be added at a position between the head tank and the head of the liquid discharge device.

In another example, the head and the carriage may form the liquid discharge device as a single unit.

In still another example, the liquid discharge device includes the head movably held by a guide that forms part of a main scan moving unit, so that the head and the main scan moving unit form a single unit. The liquid discharge device may include the head, the carriage, and the main scan moving unit that form a single unit.

In still another example, a cap that forms a part of the maintenance unit may be secured to the carriage mounting the head so that the head, the carriage, and the maintenance unit form a single unit to form the liquid discharge device.

Further, in still another example, the liquid discharge device includes tubes connected to the head tank or the head mounting a channel member so that the head and the supply unit form a single unit. A liquid in a liquid reservoir source such as an ink cartridge is supplied to the head through this tube.

The main scan moving unit may be a guide only. The supply unit may be a tube(s) only or a loading unit only.

The term "liquid discharge apparatus" used herein also represents an apparatus including the head or the liquid discharge device to drive the head to discharge a liquid. The liquid discharge apparatus may be, for example, an apparatus capable of discharging a liquid to a material to which liquid can adhere or an apparatus to discharge liquid toward gas or into liquid.

The "liquid discharge apparatus" may include units to feed, convey, and eject the material on which liquid can adhere. The liquid discharge apparatus may further include a pretreatment apparatus to coat a treatment liquid onto the material, and a post-treatment apparatus to coat a treatment liquid onto the material, onto which the liquid has been discharged.

The "liquid discharge apparatus" may be, for example, an image forming apparatus to form an image on a sheet by discharging ink, or a three-dimensional fabrication apparatus to discharge a fabrication liquid to a powder layer in which powder material is formed in layers to form a three-dimensional fabrication object.

The "liquid discharge apparatus" is not limited to an apparatus to discharge liquid to visualize meaningful images, such as letters or figures. For example, the liquid discharge apparatus may be an apparatus to form arbitrary images, such as arbitrary patterns, or fabricate three-dimensional images.

The above-described term "material on which liquid can adhere" represents a material on which liquid is at least temporarily adhered, a material on which liquid is adhered and fixed, or a material into which liquid is adhered to permeate.

Examples of the "material on which liquid can adhere" include recording media, such as paper sheet, recording paper, recording sheet of paper, film, and cloth, electronic component, such as electronic substrate and piezoelectric element, and media, such as powder layer, organ model, and testing cell.

The "material on which liquid can adhere" includes any material on which liquid can adhere, unless particularly limited.

Examples of the "material on which liquid can adhere" include any materials on which liquid can adhere even temporarily, such as paper, thread, fiber, fabric, leather, metal, plastic, glass, wood, and ceramic.

The "liquid discharge apparatus" may be an apparatus to relatively move the head and a material on which liquid can adhere. However, the liquid discharge apparatus is not limited to such an apparatus. For example, the liquid discharge apparatus may be a serial head apparatus that moves the head or a line head apparatus that does not move the head.

Examples of the "liquid discharge apparatus" further include a treatment liquid coating apparatus to discharge a treatment liquid to a sheet to coat the treatment liquid on a sheet surface to reform the sheet surface, and an injection granulation apparatus in which a composition liquid including raw materials dispersed in a solution is injected through nozzles to granulate fine particles of the raw materials.

The terms "image formation" "recording", "printing", "image printing", and "fabricating" used herein may be used synonymously with each other.

The liquid discharge head according to the present disclosure can improve the reliability of the liquid discharge head.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

The invention claimed is:

1. A liquid discharge head comprising:
   a deformable thin-film structure having a nozzle from which a liquid is dischargeable;
   an electromechanical conversion structure disposed at a periphery of the nozzle of the deformable thin-film structure;
   an insulating film covering the electromechanical conversion structure;
   a protective film over a surface of the insulating film, the protective film covering the surface of the insulating film and a surface of an electrode wiring connected to the electromechanical conversion structure; and
   an adhesion improving film disposed between the electrode wiring and the protective film,
   wherein the electromechanical conversion structure is formed directly on the deformable thin-film structure, which is a nozzle plate, and
   a thickness of the adhesion improving film is equal to or smaller than 10 nm.

2. The liquid discharge head according to claim 1, wherein the adhesion improving film is further disposed between the insulating film and the protective film.

3. The liquid discharge head according to claim 1, wherein the adhesion improving film is an $SiO_2$ film.

4. The liquid discharge head according to claim 1, wherein the adhesion improving film is film-formed by an atomic layer deposition method.

5. The liquid discharge head according to claim 1, wherein the insulating film is an $SiO_2$ film.

6. The liquid discharge head according to claim 1, wherein the protective film is a resin film formed from benzocyclobutene.

7. The liquid discharge head according to claim 1, further comprising:
   a barrier layer having a moisture permeability lower than the protective film,
   one surface of the barrier layer contacting the surface of the insulating film and the surface of the electrode wiring, and
   another surface of the barrier layer contacting the adhesion improving film.

8. The liquid discharge head according to claim 7, wherein the barrier layer is an $Al_2O_3$ film.

9. The liquid discharge head according to claim 7, wherein the barrier layer is a SiN film.

10. The liquid discharge head according to claim 1, wherein the electromechanical conversion structure has an annular shape surrounding the nozzle.

11. The liquid discharge head according to claim 1, further comprising:
    a liquid chamber communicating with the nozzle of the deformable thin-film structure.

12. A liquid discharge device comprising:
    the liquid discharge head according to claim 1; and
    a supplier to supply a liquid to the liquid discharge head.

13. A liquid discharge apparatus comprising the liquid discharge device according to claim 12.

* * * * *